(12) United States Patent
Chan et al.

(10) Patent No.: US 7,971,440 B2
(45) Date of Patent: Jul. 5, 2011

(54) THERMAL PUMP MODULE AND TEMPERATURE REGULATION

(75) Inventors: Gary K. Chan, Palo Alto, CA (US); Hai Ho, San Jose, CA (US); Joseph Jacques, Austin, TX (US)

(73) Assignee: Cisco Technology, Inc., San Jose, CA (US)

( * ) Notice: Subject to any disclaimer, the term of this patent is extended or adjusted under 35 U.S.C. 154(b) by 426 days.

(21) Appl. No.: 12/114,011

(22) Filed: May 2, 2008

(65) Prior Publication Data

US 2009/0272125 A1    Nov. 5, 2009

(51) Int. Cl.
F25B 21/02    (2006.01)
(52) U.S. Cl. .................................. 62/3.7; 62/3.3; 62/3.6
(58) Field of Classification Search ...................... 62/3.2, 62/3.3, 3.7, 259.2
See application file for complete search history.

(56) References Cited

U.S. PATENT DOCUMENTS

| | | | |
|---|---|---|---|
| 6,792,015 B1 | 9/2004 | Theodoras, II et al. | |
| 7,285,940 B2 | 10/2007 | Kerth et al. | |
| 2003/0154726 A1* | 8/2003 | Finn et al. ........................ | 62/3.7 |
| 2005/0146850 A1 | 7/2005 | Meir | |

OTHER PUBLICATIONS

Qpedia Advanced Thermal Solutions, Inc. "Cold Plate Design for Cooling Electronic Systems", www.quats.com; pp. 6-10, Norwood, MA.
Whitenack, Kathryn, "Cold Plate Analysis", LYTRON, May 17, 2005, pp. 1-20, KWhiteneck@lytron.com.
Cold Plate Design for Cooling Electronic Systems, Qpedia Thermal eMagazine, Apr. 2007, pp. 6-10, vol. 1, issue 4, www.qats.com, Advanced Thermal Solutions, Inc., Norwood, MA, USA.

* cited by examiner

*Primary Examiner* — Melvin Jones
(74) *Attorney, Agent, or Firm* — Patterson & Sheridan, LLP (57) ABSTRACT

A voltage regulator is configured to receive an input voltage from a power supply, measure a temperature associated with a heat transfer medium, produce an output voltage to drive a thermo-electric cooler, and vary the output voltage in accordance with changes in the measured temperature. Varying the output voltage results in: 1) extracting of heat from the heat transfer medium when the measured temperature is above a threshold value, or 2) supplying of heat to the heat transfer medium when the measured temperature is below a threshold value. The voltage regulator can cap upper and lower bounds of the output voltage to prevent the thermo-electric cooler from reaching its saturation point. The voltage regulator can be configured to produce an output voltage having reduced voltage ripple.

21 Claims, 11 Drawing Sheets

910
RECEIVE AN INPUT VOLTAGE FROM A POWER SUPPLY

920
MEASURE A TEMPERATURE OF A HEAT TRANSFER MEDIUM BASED ON A TEMPERATURE SENSOR, PRODUCE AN OUTPUT VOLTAGE TO DRIVE A THERMO-ELECTRIC COOLER COUPLED TO THE HEAT TRANSFER MEDIUM

930
VARY THE OUTPUT VOLTAGE IN ACCORDANCE WITH CHANGES IN THE MEASURED TEMPERATURE AS IDENTIFIED BY THE TEMPERATURE SENSOR

1030
VARY THE OUTPUT VOLTAGE IN ACCORDANCE WITH CHANGES IN THE MEASURED TEMPERATURE AS IDENTIFIED BY THE TEMPERATURE SENSOR

1032
ADJUST THE OUTPUT VOLTAGE TO: I) CONTROL THE THERMO-ELECTRIC COOLER TO EXTRACT HEAT FROM THE HEAT TRANSFER MEDIUM WHEN THE MEASURED TEMPERATURE IS ABOVE A FIRST THRESHOLD VALUE, AND II) CONTROL THE THERMO-ELECTRIC COOLER TO SUPPLY HEAT TO THE HEAT TRANSFER MEDIUM WHEN THE MEASURED TEMPERATURE IS BELOW A SECOND THRESHOLD VALUE

1034
PRODUCE THE OUTPUT VOLTAGE TO HAVE A RIPPLE OF LESS THAN ABOUT 1 PERCENT

1040
DEACTIVATE A RELAY TO ELECTRICALLY DECOUPLE THE PRODUCED VOLTAGE FROM THE THERMO-ELECTRIC COOLER WHEN THE CORRESPONDING MAGNITUDE OF A MEASURED TEMPERATURE IS BELOW A THRESHOLD VALUE OR IS BETWEEN A PAIR OF THRESHOLD VALUES

1050
SELECTIVELY POWER OFF THE ANALOG CONTROL CIRCUIT WHEN THE CORRESPONDING TEMPERATURE DOES NOT EXCEED A THRESHOLD VALUE OR IS BETWEEN A PAIR OF THRESHOLD VALUES

*FIG. 10*

THERMAL PUMP MODULE AND TEMPERATURE REGULATION

FIELD OF THE INVENTION

The present disclosure relates generally to methods, systems, and computer readable media encoded with instructions, etc., for regulating temperature. For example, embodiments disclosed herein include novel ways to regulate the temperature of electronic devices by cooling the devices when the devices are too warm and heating the devices when the devices are too cool.

BACKGROUND

As electronic devices, such as switches and routers, become more powerful, they tend to generate more heat and may overheat unless some cooling technique is applied.

One known method for cooling electronic devices is to measure the temperature of a heat transfer medium (e.g., a cold plate) placed near or in contact with the device to be cooled. This temperature is then used to determine the amount of power supplied to a thermo-electric cooler that is placed in contact with the heat transfer medium. As the measured temperature of the heat transfer medium rises, more power is supplied to the thermo-electric cooler causing the thermo-electric cooler to pump more heat from the heat transfer medium, which in turn draws heat away from the electronic device to be cooled. As the temperature of the heat transfer medium drops, the amount of power to the thermo-electric cooler is reduced to save power. In this manner, the temperature of the electronic device is maintained within a desirable range, reducing the chance of damaging the device based on overheating.

BRIEF DESCRIPTION OF THE DRAWINGS

Objects, features, and advantages of inventive matter disclosed herein may be better understood by referring to the following description in conjunction with the accompanying drawings, in which like numerals indicate like structural elements and features in the various figures. The drawings are not meant to limit the scope of the invention. For clarity, not every element may be labeled in every figure. The drawings are not necessarily to scale, emphasis instead being placed upon illustrating the principles of the inventive matter.

DESCRIPTION OF EXAMPLE EMBODIMENTS

Overview

In general, embodiments herein include methods, apparatus, encoded computer readable media, systems, etc. useful for regulating the temperature of a heat sink and/or one or more electronic devices.

A first example disclosure embodiment as described herein includes a system comprising a thermo-electric cooler, at least one temperature sensor, and an analog control circuit configured to produce a voltage signal to drive the thermo-electric cooler. The thermo-electric cooler is coupled to a heat transfer medium. The at least one temperature sensor monitors a corresponding temperature of the heat transfer medium. The magnitude of the voltage signal produced by the analog control circuit depends on the corresponding temperature of the heat transfer medium as measured by the at least one temperature sensor. The at least one temperature sensor (e.g., one or more resistive elements whose resistances change with temperature) can reside in a feedback path, resistor ladder, etc. of the analog regulator circuit. Because the at least one temperature sensor resides in the resistor ladder, feedback path, etc., resistive changes in the temperature sensor cause the output voltage of the voltage regulator to vary.

A second example embodiment includes a method for regulating the temperature of electronic devices. The method includes receiving an input voltage (e.g., a constant DC voltage) from a power supply. The method further includes measuring a temperature of a heat transfer medium based on a temperature sensor associated with an analog regulator control circuit. In one embodiment, because the temperature sensor resides in the resistor ladder, feedback path, etc. of the analog control circuit, a resistive change of the temperature sensor changes the output voltage of the control circuit.

The analog control circuit produces the output voltage to drive a thermo-electric cooler coupled to the heat transfer medium. Thus, a method according to embodiments herein includes varying the output voltage in accordance with changes in the measured temperature as identified by the temperature sensor.

A third example embodiment includes an apparatus comprising a heat transfer medium, a thermo-electric cooler thermo-conductively coupled to the heat transfer medium, and a voltage regulator. The voltage regulator can be configured to receive an input voltage from a power supply, measure a temperature associated with the heat transfer medium, produce an output voltage to drive the thermo-electric cooler, and vary the output voltage applied to the thermo-electric cooler. In accordance with changes in the measured temperature of the heat transfer medium, the voltage regulator initiates extracting heat from the heat transfer medium when the measured temperature is above a first threshold value and supplying heat to the heat transfer medium when the measured temperature is below a second threshold value.

DETAILED DESCRIPTION

Some electronic devices (e.g., switches and routers) are used in environments that subject the electronic devices to extreme ambient temperature ranges. For example, Industrial Ethernet switches may be required to work in environment where the ambient temperature ranges from −40° C. to 74° C. Such devices may be deployed, for example, in power substations or outdoors as traffic controllers.

Components operating inside an electronic device such as a switch have a limited operating temperature range outside of which the component may fail. For example, if a switch is exposed to extreme heat or extreme cold, the device may temporarily fail or be permanently damaged.

One such component that is susceptible to extreme temperature is a Small Form-Factor Pluggable (e.g., an SFP) device. An SFP device is a compact optical transceiver used in optical communications such as telecommunication applications and data communication applications.

Generally, an SFP device interfaces a network device mother board (for a switch, router, or similar device) to a fiber optic or unshielded twisted pair networking cable. Industrial-grade SFP devices typically have an operating temperature range of −10° C. to 85° C. case temperature. If the temperature of an SFP's case rises above 85° C. or falls below −10° C., the SFP may fail to operate correctly.

When the ambient temperature of an electronic device approaches or reaches an upper temperature bound (e.g. 74° C.) of a safe temperature working range, the device may fail because the internally generated heat in a device typically causes the temperature inside the device to exceed the ambient temperature in which the device is operating. If the temperature of a component inside the device exceeds the component's operating range, the component is in danger of failing. For example, an Industrial Ethernet Switch operating in an ambient temperature of 74° C. may include an SFP that reaches a temperature above 85° C. and fails to operate correctly.

Extreme cold temperature can damage a respective electronic device as well. For example, when the ambient temperature in which an electronic device is operating approaches or reaches the lower bound (e.g., −40° C.) of the required working range, the heat generated by components (e.g., an SFP) inside the electronic device may be insufficient to keep the temperature of the component above the minimum operational temperature for the component. For example, an Industrial Ethernet Switch operating in an ambient temperature of −40° C. may include an SFP whose temperature has fallen below the −10° C. minimum operating temperature. As mentioned above, this cold condition can cause the SFP to fail.

In general, embodiments disclosed herein include methods, apparatus, systems, etc. for regulating the temperature of electronic devices. As an example, a voltage regulator is configured to receive an input voltage from a power supply, measure a temperature associated with a heat transfer medium, produce an output voltage to drive a thermo-electric cooler, and vary the output voltage in accordance with changes in the measured temperature. Varying the output voltage results in: 1) extracting of heat from the heat transfer medium when the measured temperature is above a first threshold value, or 2) supplying of heat to the heat transfer medium when the measured temperature is below a second threshold value. The voltage regulator can cap upper and lower bounds of the output voltage to prevent the thermo-electric cooler from reaching its saturation point. The voltage regulator can be configured to produce an output voltage having reduced voltage ripple. Voltage ripple reduces the efficiency of the thermo-electric cooler. The less the ripple, the more desirable the circuit.

Figure 1A:
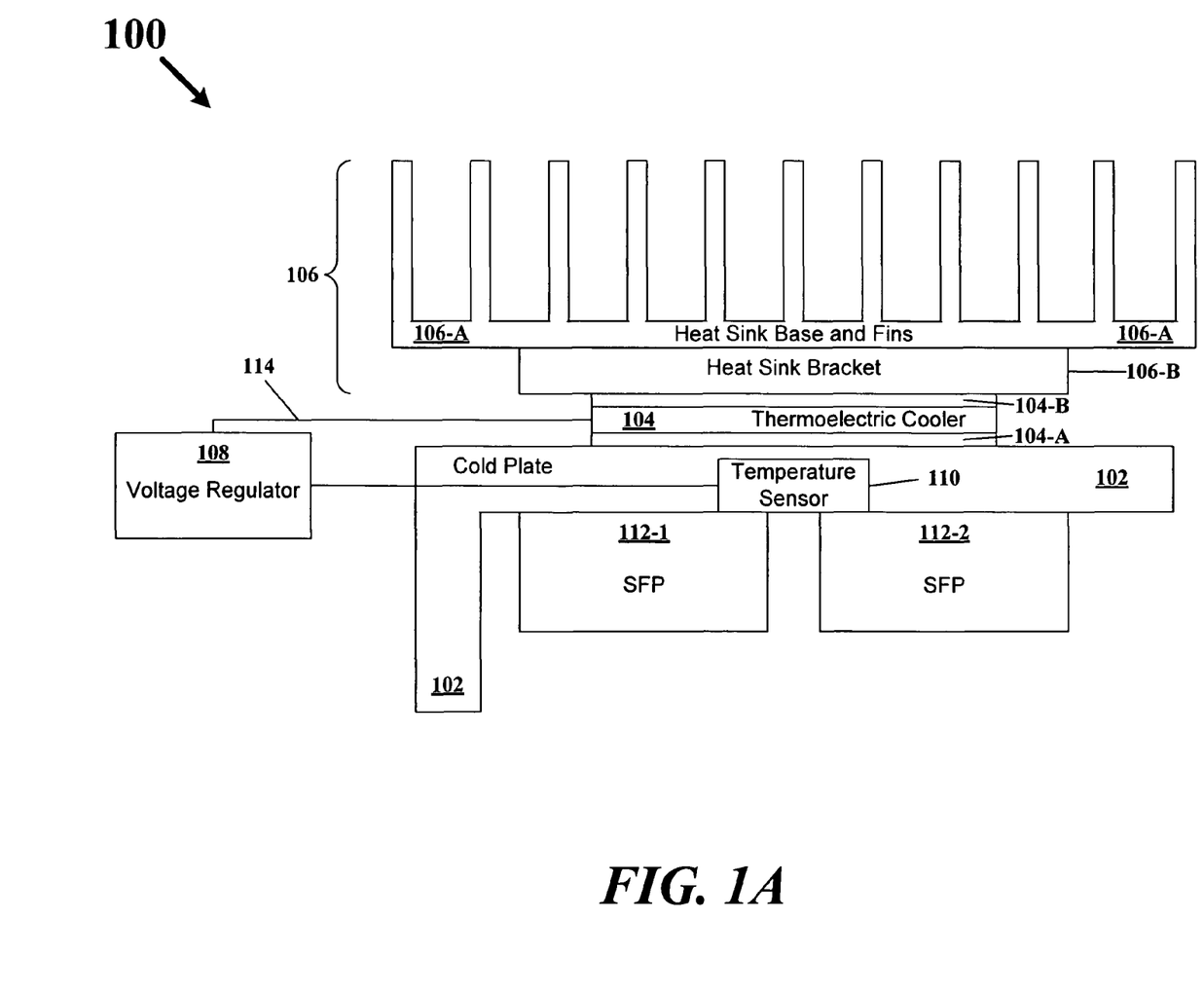
FIG. 1A illustrates an example system for regulating the temperature of one or more electronic devices according to embodiments disclosed herein.

More specifically, FIG. 1A is an example diagram illustrating a system 100 for regulating the temperature of one or more devices according to embodiments herein. As shown, the system 100 includes a cold plate 102 (e.g., a heat transfer medium) to which the SFP devices 112 (e.g., SFP device 112-1 and SFP device 112-2) are coupled (e.g., attached, affixed, in direct contact, sliding contact, etc.).

In one embodiment, the SFP devices 112 are thermally coupled to the cold plate 102. Thus, when the SFP devices 112 are hotter than the cold plate 102, heat flows in a direction from the SFP devices 112 to the cold plate 102.

When the SFP devices 112 are colder than the cold plate 102, heat flows in a direction from the cold plate 102 to the SFP devices 112. Thus, the SFP devices 112 are positioned such that heat can transfer from the SFP devices 112-1, 112-2 to the cold plate 102 as well as from the cold plate 102 to the SFP devices.

The cold plate 102 can be made from a material supporting thermal transfer. By way of a non-limiting example, the cold plate 102 can be formed from or include a metallic material or alloy such as aluminum, copper, steel, etc.

In system 100 as shown, the heat sink 106 absorbs and dissipates heat from the thermo-electric cooler 104 depending on a value of the voltage 114 produced by voltage regulator 108. In a similar manner as discussed above, the heat sink 106 can be made of a good thermal conductor, such as aluminum, copper, or some other thermally conductive alloy. In general, a heat sink 106 can comprise a heat sink bracket 106-B made from a metal alloy such as Aluminum, copper or steel. In one embodiment, the heat sink 106 can include fins to aid in the dissipation or absorption of heat from the air (to which the fins of heat sink 106 are exposed). The heat sink bracket 106-B is thermally coupled to (i.e., conducts the heat to or from) the heat sink base and fins 106-A. The entire assembly 106-A and 106-B is denoted the heat sink 106. The heat sink bracket 106-B can be bolted to the heat sink base and fins 106-A or the entire assembly 106 can be formed or machined from a single piece of metal.

Figure 1B:
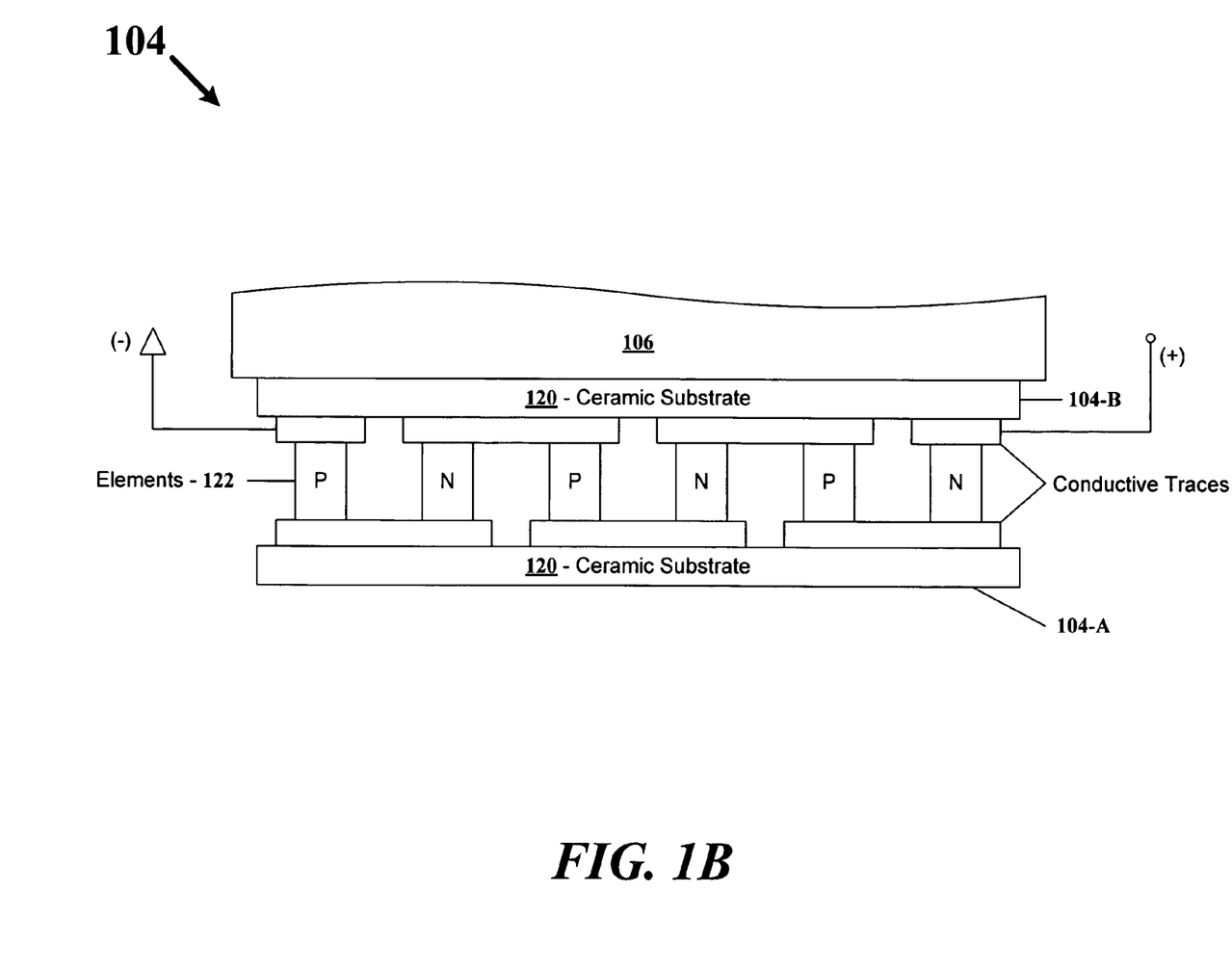
FIG. 1B illustrates a typical thermo-electric cooler that can be advantageously used in embodiments disclosed herein.

FIG. 1B illustrates a typical thermo-electric cooler that can be advantageously used in embodiments disclosed herein, such as the thermo-electric cooler 104 shown in FIG. 1A. A typical thermo-electric cooler 104 is composed of two ceramic substrates 120 that serve as a housing and electrical insulation for P-type and N-type (typically Bismuth Telluride) elements 122 between the substrates 120. A thermo-electric cooler module contains several P-N couples that are connected electrically in series and thermally in parallel.

The thermo-electric cooler 104 has 2 sides, a cold side 104-A and a hot side 104-B. The thermo-electric cooler 104 has 2 leads: a positive lead (+) and a negative (−) lead. Typically, thermo-electric coolers in the prior art operate in cooling mode. In cooling mode, positive voltage is applied to the (+) lead and heat is extracted from the cold side 104-A and pumped to the hot side 104-B. All the heat, including the applied thermo-electric cooler power, is dumped into the hot side 104-B (i.e., Qb=Qa+Q power supply).

When a negative voltage is supplied to the (+) lead of the same thermo-electric cooler 104, it operates in reverse mode (i.e., heating mode). In heating mode, current flows in the opposite direction of the current flow when the thermo-electric cooler 104 is in cooling mode and the direction of pumped heat is reversed. That is, in heating mode, the thermo-electric cooler 104 pumps heat from side 104-B (normally the hot side) into side 104-A (normally the cold side). An advantage of this is that a heat transfer medium can be permanently affixed to side A and it can be cooled or heated on demand by inverting the voltage polarity on the voltage regulator 108.

In heating mode, as a measured temperature of the heat transfer medium drops beyond a desired operating temperature range, more power is supplied to the thermo-electric cooler 104 with current flowing in reverse, causing the thermo-electric cooler 104 to pump more heat into the heat transfer medium, which in turn delivers more heat into the electronic device to be heated. As the temperature of the heat transfer medium rises, the amount of power to the thermo-electric cooler is reduced to save power. In this manner, the temperature of the electronic device is maintained within a desirable range, reducing the chance of damaging the device based on freezing.

One example of a thermo-electric cooler successfully used in particular embodiments is available from Melcor as P/N HT2-12-30. Other commercially available thermo-electric coolers can also be successfully utilized in embodiments disclosed herein.

The output voltage produced by the voltage regulator 108 controls the direction of thermal energy. For example, the thermo-electric cooler 104, when supplied with a positive voltage (e.g., when output voltage 114 is a positive value), pumps heat present at the cold plate side 104-A of the thermo-electric cooler to the heat sink side 104-B of the thermo-electric cooler 104. This has the effect of reducing a temperature of the cold plate 102 and thus cooling of the SFP devices 112. As the magnitude of the supplied positive output voltage 114 increases, the amount of heat pumped from the cold plate 102 through the thermo-electric cooler 104 to the heat sink 106 also increases.

When the output voltage 114 as produced by the voltage regulator 108 is negative, the thermo-electric cooler 104 pumps heat from the heat sink 106 and transfers the collected heat to the cold plate 102. The temperature of the cold plate thus increases, which results in heating of the SFP devices 112-1, 112-2. As the magnitude of the supplied negative output voltage 104 increases, the amount of heat pumped from the heat sink 106 increases so that cold plate and thus SFP devices heat at a faster rate.

To regulate temperature, the system 100 includes a temperature sensor 110 for monitoring the temperature of the heat transfer medium (i.e., the cold plate 102) and/or SFP devices 112. As its name suggests, temperature sensor 110 can generally be any type device whose characteristics change with temperature. By way of a non-limiting example, the temperature sensor 110 can be a resistive device whose resistance changes with temperature.

Positioning of the temperature sensor 110 may vary depending on the embodiment. For example, the temperature sensor 110 can be embedded, attached, co-located, etc. on or near the cold plate 102.

In the context of the present example, the temperature sensor 110 is a thermistor whose resistance varies depending on the corresponding temperature of the cold plate 102. Thus, the resistance of the temperature sensor 110 at a given point in time at least theoretically or approximately reflects the temperature of the cold plate 102, SFP devices 112, and/or the cold plate side 104-A of the thermo-electric cooler 104.

Although the system 100 is shown including a single temperature sensor, note that system 100 can be configured to include a number of temperature sensors as will be discussed in the following figures.

As previously discussed, the system 100 includes a voltage regulator 108 that produces a voltage signal 114 to drive the thermo-electric cooler 104. The voltage regulator 108 produces a voltage signal 114 having a magnitude and polarity that depends on the corresponding temperature of the cold plate 102 as measured by the temperature sensor 110.

In the cooling mode, as the monitored temperature of the cold plate 102 increases, the voltage regulator 108 increases the magnitude of the positive voltage driving the thermo-electric cooler 104. Increasing the magnitude of the output voltage 114, in turn, increases the rate at which heat is pumped away from the cold plate 102 and transferred to the heat sink 106, reducing the chance that the SFP devices 112-1, 112-2 overheat.

In heating mode, as the monitored temperature of the cold plate 102 decreases as sensed by the temperature sensor 110, the voltage regulator 108 increases the magnitude of the negative output voltage 114 driving the thermo-electric cooler 104. The increased negative voltage, in turn, increases the rate at which heat is pumped from the heat sink 106 and transferred to the cold plate 102 to warm the SFPs 112-1, 112-2.

In particular embodiments, the voltage regulator 108 can be configured to operate only in cooling mode. This may be useful in cases where the SFP devices 112 are not in danger of getting too cold but instead are in danger of getting too hot. In such an embodiment, to provide cooling, the voltage regulator 108 produces the output voltage 114 to be a voltage of zero volts when the monitored temperature is below a particular threshold temperature (e.g. 48° C.) and will operate in cooling mode when the monitored temperature is at or greater than the threshold temperature.

In particular embodiments, the voltage regulator 108 can be configured to operate only in heating mode. This may be useful in cases where the SFP devices 112 are not in danger of getting too hot but instead are in danger of getting too cold. In such an embodiment, to provide heating, the voltage regulator 108 produces the output voltage 114 to be a voltage of zero volts when the monitored temperature is above a particular threshold temperature (e.g. 10° C.) and will operate in heating mode when the monitored temperature is at or less than the threshold temperature.

In other embodiments, the voltage regulator 108 operates in a dual mode (e.g., cooling mode or heating mode depending on whether the SFP devices are too hot or too cold). In the dual mode, the voltage regulator 108 will operate in the cooling mode when the temperature as sensed by the temperature sensor 110 is above a threshold value as discussed above. In addition to potentially operating in the cooling mode when the temperature of the cold plate is hot, the voltage regulator 108 can be configured to operate in a heating mode when the temperature as sensed by the temperature sensor 110 is below a threshold value (e.g., 10° C.). The heating mode prevents the SFP devices 112 from conditions such as icing, condensation, getting too cold, etc.

When in the heating mode, the voltage regulator 108 keeps the temperature of the SFP devices 112 from dropping below the device's operating temp limit. For example, some SFPs have lower limit on their operating temperature range of about −10° C. As mentioned above, a voltage regulator 108 operating in heating mode can help prevent damage caused by having moisture from dew or frost, for example, from accumulating on the surface of an electronic device or seeping into the electronic device's casing.

In particular embodiments, the voltage regulator 108 caps the magnitude of the voltage signal 114 to avoid so-called "stalling" the thermo-electric cooler 104 and wasting energy.

More specifically, as the voltage regulator 108 increases the voltage of the voltage signal 114, the thermo-electric cooler 104 pumps more heat. However, the temperature difference between the cold side of the thermo-electric cooler 104 and the hot side of the thermo-electric cooler 104 increases, making the thermo-electric cooler 104 less efficient. At some point (referred to herein as the "saturation point"), the thermo-electric cooler 104 can become so inefficient that it "stalls," meaning that the thermo-electric cooler 104 fails to increase the rate at which heat is pumped even if the thermo-electric cooler 104 further increases the magnitude of the voltage. In fact, if the voltage regulator 108 continues to increase the magnitude of the voltage supplied to the thermo-electric cooler 104 beyond the saturation point, the thermo-electric cooler 104 may "backfire," meaning the thermo-electric cooler 104 starts pumping heat at a reduced rate even as the voltage regulator 108 continues to increase the magnitude of the voltage.

To prevent stalling as discussed above, the voltage regulator 108 can be configured to cap the magnitude of the supplied voltage at a value less than or about equal to the amount of voltage at which the thermo-electric cooler 104 reaches its saturation point. For example, the voltage regulator 108 can be configured to cap the magnitude of the output voltage 114 supplied to the thermo-electric cooler 104 during the cooling mode to an example value around +5 volts. Additionally, the voltage regulator 108 can be configured to cap the magnitude of the voltage supplied to the thermo-electric cooler 104 during the heating mode to an example value of around −5 volts. Of course, the cap values of −5 and +5 volts are presented by way of example only and the actual values may vary depending on the application and at what voltage values the thermo-electric cooler being driven stalls.

Figure 2:
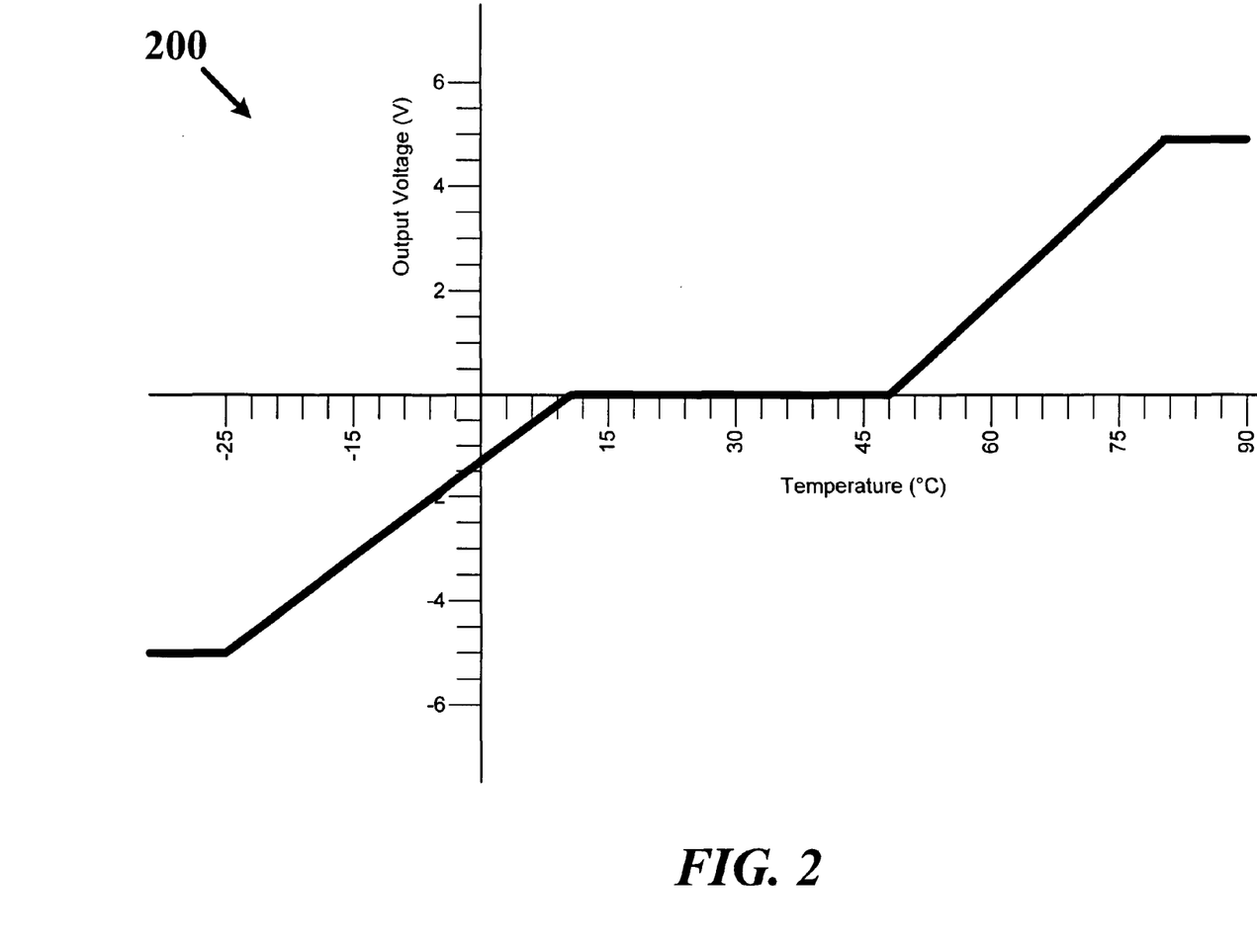
FIG. 2 illustrates a graph showing a targeted output voltage versus measured temperature according to embodiments disclosed herein.

FIG. 2 illustrates a graph showing the output voltage 114 versus temperature according to embodiments herein. As shown, in particular embodiments, the voltage regulator 108 supplies zero volts to the thermo-electric cooler 104 when the temperature as indicated by the temperature sensor 110 is between about 10° C. and about 48° C. In such a range, the thermo-electric cooler 104 is deactivated because the SFP devices 112 is likely operating in a safe temperature range.

When the sensed temperature is above 48° C., the voltage regulator 108 operates in cooling mode as a result of the voltage regulator 108 supplying the thermo-electric cooler 104 with an output voltage 114 between 0 volts and +5 volts. Above 80° C., the voltage regulator 108 caps the output voltage 114 to +5 volts to prevent stalling. As previously discussed, the thermo-electric cooler 104 transfers heat from the cold plate 102 to the heat sink 106 when in the cooling mode.

When the temperature sensed by the temperature sensor 110 is below about 10° C., the voltage regulator 108 operates in a heating mode based on the voltage regulator 108 supplying the thermo-electric cooler 104 with a negative voltage between 0 volts and −5 volts. The output voltage 114 is capped at −5 volts for temperatures less than a value such as −25° C. As previously discussed, the thermo-electric cooler 104 transfers heat from the heat sink 106 to the cold plate 102 when in the heating mode.

Figure 3:
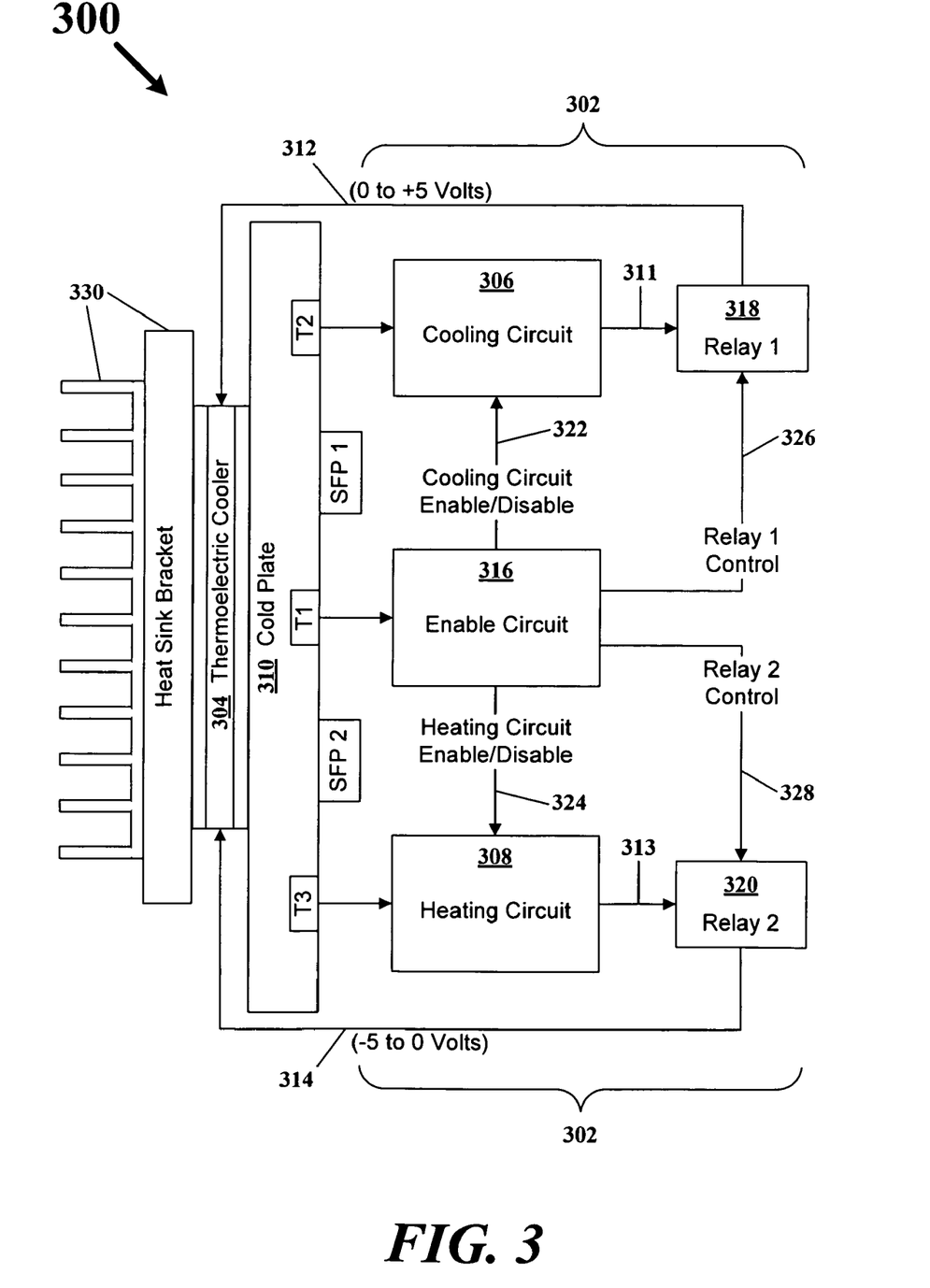
FIG. 3 is a diagram illustrating a voltage regulator for powering a thermo-electric cooler device to regulate the temperature of one or more electronic devices according to embodiments disclosed herein.

FIG. 3 is a diagram 300 illustrating a thermal regulator system 300 according to embodiments herein. In the context of the present example, the voltage regulator comprises an analog control circuit 302, SFP devices (e.g., SFP1 and SFP2), cold plate 310, thermo-electric cooler 304, and heat sink 330.

The analog control circuit 302 operates off input power such as 12 volt DC. In a similar manner as discussed above in FIG. 1, the analog control circuit 302 in FIG. 3 is configured to produce output voltage 311 and output voltage 313 to selectively drive thermo-electric cooler 304. By way of a non-limiting example, and in a manner as previously discussed, the analog control circuit 302 caps the magnitude of the voltage signal provided to the thermo-electric cooler 304 at a voltage magnitude between about −5 volts to about +5 volts in order to prevent the thermo-electric cooler 304 from reaching or going beyond its saturation point.

More specifically, analog control circuit 302 is a two-part circuit including cooling circuit 306 and heating circuit 308. As will be discussed below, the cooling circuit 306 produces a range of positive output voltages to cool the SFP devices when the temperature of the cold plate 310 is above 48° C. The heating circuit 308 produces a range of negative output voltages to cool the SFP devices when the temperature of the cold plate 310 is below 10° C.

The voltage regulator includes three temperature sensors T1, T2, T3. Each of the two analog regulator circuits 306, 308 produces an output voltage having a magnitude depending on the temperature of the cold plate 310.

For example, temperature sensor T2 such as a resistive device can reside in a resistor ladder of cooling circuit 306. A change in the resistance of temperature sensor T2 changes a value of a voltage associated with the resistor ladder of cooling circuit 306, resulting in the variable output voltage 311 values in accordance with the temperatures above 48° C. as shown in FIG. 2.

Temperature sensor T3 such as another resistive device can reside in a resistor ladder of heating circuit 308. A change in the resistance of temperature sensor T3 changes a value of a voltage associated with the resistor ladder associated with heating circuit 308, resulting in the variable output 313 values in accordance with the temperatures below 10° C. as shown in FIG. 2.

The analog control circuit 302 can include an enable circuit 316. In the context of the present example, the enable circuit 316 is configured to monitor the temperature of the cold plate 310 (or other medium in thermal contact with the SPF devices) and produce a disable signal to shutdown and/or power off the corresponding portion of analog circuit 302. Powering off portions of the analog control circuit 302 such as cooling circuit 306 and heating circuit 308 helps save energy during times when the thermo-electric cooler 304 does not need to be activated to respectively heat or cool the cold plate 310.

By way of a non-limiting example, the enable circuit 316 monitors the temperature of the cold plate 310 via temperature sensor T1. When the enable circuit 316 senses that the temperature is greater than a threshold value such as 48° C., the enable circuit 316 sets signal 322 to an appropriate state to activate cooling circuit 306. In the activated state, the cooling circuit 306 then produces the output voltage 311 in accordance with the graph as shown in FIG. 2 depending on temperature. When the enable circuit 316 senses that the temperature is less than a threshold value such as 48° C., the enable circuit 316 sets signal 322 to an appropriate state to deactivate cooling circuit 306. In the deactivated state, the cooling circuit 306 produces an output voltage 311 of approximately zero volts or other value to conserve energy.

When the enable circuit 316 senses that the temperature is less than a threshold value such as 10° C., the enable circuit 316 sets signal 324 to an appropriate state to activate heating circuit 308. In the activated state, the heating circuit 308 then produces the output voltage 313 as shown in FIG. 2 depending on temperature. When the enable circuit 316 senses that the temperature is greater than a threshold value such as 10° C., the enable circuit 316 sets signal 324 to an appropriate state to deactivate heating circuit 308. In the deactivated state, the heating circuit 308 produces an output voltage 313 of approximately zero volts.

The analog control circuit 302 includes relay 318 and relay 320. Relay 318 is disposed between the cooling circuit 306 and the thermo-electric cooler 304. Relay 320 is disposed between the heating circuit 308 and the thermo-electric cooler 304.

As illustrated, the enable circuit 316 can be configured to drive each relay, via a corresponding control signal, to electrically decouple a corresponding portion of the analog circuit 302 from the thermo-electric cooler 304 when the corresponding temperature, as measured by T1, is above or below a threshold value.

More specifically, when the temperature as measured by temperature sensor T1 is above an example threshold value of 48° C., via signal 326, the enable circuit 316 activates or closes relay 318 to electrically connect output voltage 311 to conductive path 312. In such an instance, the output voltage 311 of cooling circuit 306 drives the thermo-electric cooler 304 with a voltage as specified by the graph 200 for temperatures above 48° C. Below 48° C., the enable circuit 316 deactivates or opens relay 318 to electrically decouple output voltage 311 from conductive path 312 so that cooling circuit 306 is no longer electrically connected to control the thermo-electric cooler 304.

Additionally, when the temperature as measured by temperature sensor T1 is below an example threshold value of 10° C., via signal 328, the enable circuit 316 activates or closes relay 320 to electrically connect output voltage 313 to conductive path 314. In such an instance, the output voltage 313 of heating circuit 308 drives the thermo-electric cooler 304 with a voltage as specified by the graph 200 for temperatures below 10° C. Above 10° C., the enable circuit 316 deactivates or opens relay 320 to electrically decouple output voltage 313 from conductive path 314 so that heating circuit 308 is no longer electrically connected to control the thermo-electric cooler 304.

Accordingly, the enable circuit 316 powers on the cooling circuit 306, via the cooling enable/disable signal 322, and drives relay 318, via the relay control signal 326, to couple the cooling circuit 306 to the thermo-electric cooler 304 when the temperature of the cold plate 310, as measured by the temperature sensor T1, exceeds (i.e., is above) about 48° C. The enable circuit 316 powers off the cooling circuit 306, via the enable/disable signal 322, and drives relay 318, via signal 326, to decouple the cooling circuit 306 from the thermo-electric cooler 304 when the temperature of the cold plate 310, as measured by the temperature sensor T1, does not exceed (i.e., is below) about 48° C. Similarly, the enable circuit 316 powers on the heating circuit 308, via the heating enable/disable signal 324, and drives relay 320, via the relay control signal 328, to couple the heating circuit 308 to the thermo-electric cooler 304 when the temperature of the cold plate 310, as measured by the temperature sensor T1, is below about 10° C. The enable circuit 316 powers off the heating circuit 308, via the enable/disable signal 324, and drives relay 320, via the relay control signal 328, to decouple the heating circuit 308 from the thermo-electric cooler 304 when the temperature of the cold plate 310, as measured by the temperature sensor T1, is above about 10° C.

When the temperature of the cold plate 310, as measured by the temperature sensor T1, is between about 10° C. and about 48° C., the enable circuit 316 powers off both the cooling circuit 306 and the heating circuit 308 and decouples both the cooling circuit 306 and the heating circuit 308 from the thermo-electric cooler 304.

The analog control circuit 302 can be configured to produce output voltage 311 and output voltage 313 to have a ripple of less than about 5 percent. In other embodiments, the analog control circuit 302 provides the voltage signal to the thermo-electric cooler 304 with a ripple of less than about 1 percent. A detailed example circuit to produce the output voltage 311 and output voltage 313 with a ripple voltage of less than 1% is shown in FIG. 4.

Figure 4:
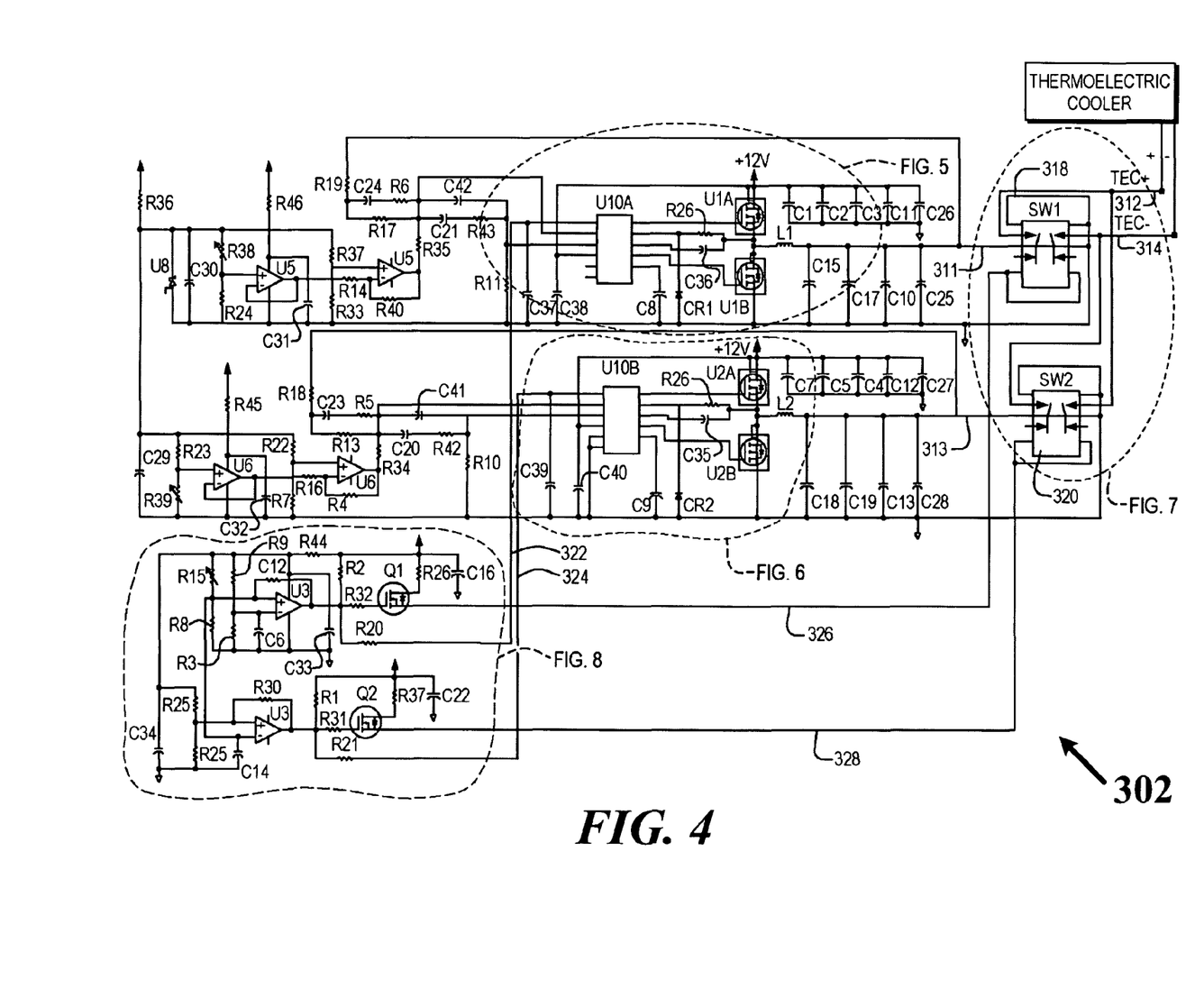
FIG. 4 illustrates a circuit design useful in implementing analog control circuits in systems for regulating the temperature of electronic devices according to embodiments disclosed herein.

FIG. 4 is an example diagram illustrating analog control circuit 302 according to embodiments herein. In this example circuit, temperature sensor T1 is implemented by variable resistor R15; temperature sensor T2 is implemented by variable resistor R38; and temperature sensor T3 is implemented by variable resistor R39.

Relay 318 is implemented by SW1. Relay 320 is implemented by SW2. The voltage signal 312 produced by the cooling circuit 306 is labeled as TEC+ and the voltage signal 314 produced by the heating circuit 308 is labeled as TEC−. TEC+ 312 is connected to a positive (+) lead and TEC− 314 is connected to a negative (−) lead of the thermo-electric cooler 304 as shown in FIG. 3.

Example component values for the different parts in analog control circuit 302 such as resistors, inductors, capacitors, etc., are shown below in Table 1.

TABLE 1

| Ref Des | Description | P/N | QTY |
| --- | --- | --- | --- |
| TEC | Thermo-electric cooler | Melcor HT2-12-30 | 1 |
| C1-C5, C7-C9, C16, C22 | CAP, CE, 10uF, 16 V, 20%, SM, 1206 | 11-1540-01 | 10 |
| C6, C10-C14 | CAP, CE, 1uF, 16 V, 10%, SM, 0603 | 11-2806-01 | 6 |
| C25-C40 | CAP, CE, .1uF, 16 V, 10%, SM, 0603 | 11-0995-01 | 16 |
| C15, C17-C19 | CAP, CE, 47uF, 16 V, 20%, SM, 1210 | 11-2880-01 | 4 |
| C20, C21 | CAP, CE, 5600 pF, 50 V, 20%, SM, 0603 | 11-1019-01 | 2 |
| C23, C24 | CAP, CE, 560 pF, 50 V, 5%, SM, 0603 | 11-2312-01 | 2 |
| C41, C42 | CAP, CE, 120 pF, 50 V, 5%, SM, 0603 | 11-1002-01 | 2 |
| CR1, CR2 | DIO, SH, MBR0540T1, .51 V/.5 A, SOD123 | 13-0846-01 | 2 |
| L1, L2 | INDUCT, PWR, 33uH, 20%, 2.0 A, SM, 3316 | 24-1882-01 | 2 |
| Q1, Q2 | XTR, NCH, FDN337, 30 V/2.2 A, SOT23 | 20-0207-01 | 2 |
| SW1, SW2 | RELAY, COIL, 2 C, 12 V/11.7 mA, SMD10 | 23-0718-01 | 2 |
| U1, U2 | XTR, NCH, SI4330, DUAL, 30 V(D-S), MOSFET, SO8 | 20-xxxx-01 | 2 |
| U3 | IC, LM339A, CMPR, QUAD, SO14 | 15-1504-01 | 1 |
| U5, U6 | IC, LINEAR, TLV2372, OP AMP, −40 C to 125 C, SO8 | 15-xxxxx-01 | 2 |

TABLE 1-continued

| Ref Des | Description | P/N | QTY |
|---|---|---|---|
| U8 | IC, LINEAR, LM4040A, Shunt VRef, 4.1 V, SOT23-3 | 15-10643-01 | 1 |
| U10, U11 | IC, LINEAR-STD TPS40190 BUCK CONTROLLER | 15-10240-01 | 2 |
| R15, R38, R39 | RES, NTC THERMISTORS, 10K, .100 W, 5%, SM, 0805 | 12-2205-01 | 3 |
| R1, R2 | RES, TF, 10K, .063 W, 0.1%, SM, 0603 | 12-4063-01 | 2 |
| R3 | RES, TF, 4.81K, .125 W, 0.1%, SM, 0603 | 12-4724-01 | 1 |
| R4 | RES, TF, 48.7K, .063 W, 1%, SM, 0603 | 12-1848-01 | 1 |
| R7, R33, R40 | RES, TF, 49.9K, .063 W, 1%, SM, 0603 | 12-1870-01 | 3 |
| R13, R17 | RES, TF, 187K, .063 W, 1%, SM, 0603 | 12-3816-01 | 2 |
| R8, R9, R25 | RES, TF, 4.7K, .063 W, 0.1%, SM, 0603 | 12-4376-01 | 3 |
| R5, R6, R10, R11 | RES, TF, 4.02K, .063 W, 1%, SM, 0603 | 12-1984-01 | 4 |
| R12, R16, R30 | RES, TF, 100K, .063 W, 1%, SM, 0603 | 12-1965-01 | 3 |
| R18, R19 | RES, TF, 0, .063 W, 1%, SM, 0603 | 12-1169-01 | 2 |
| R20, R21 | RES, TF, 1K, .063 W, 1%, SM, 0603 | 12-1459-01 | 2 |
| R22 | RES, TF, 133K, .063 W, 1%, SM, 0603 | 12-2531-01 | 1 |
| R23 | RES, TF, 18.2K, .063 W, 1%, SM, 0603 | 12-2646-01 | 1 |
| R24 | RES, TF, 4.32K, .063 W, 0.1%, SM, 0603 | 12-4154-01 | 1 |
| R26, R27 | RES, TF, 100, .250 W, 1%, SM, 1210 | 12-1709-01 | 2 |
| R28, R29 | RES, TF, 3.32, .1OOW, 1%, SM, 0805 | 12-1918-01 | 2 |
| R31, R32 | RES, TF, 100, .063 W, 1%, SM, 0603 | 12-1495-01 | 2 |
| R34, R35 | RES, TF, 24.9K, .063 W, 1%, SM, 0603 | 12-1448-01 | 2 |
| R37 | RES, TF, 115K, .063 W, 1%, SM, 0603 | 12-3881-01 | 1 |
| R36 | RES, TF, 2.0K, .063 W, .1%, SM, 0603 | 12-4141-01 | 1 |
| R41 | RES, TF, 1.3K, .063 W, 1%, SM, 0603 | 12-1958-01 | 1 |
| R42, R43 | RES, TF, 19.6K, .063 W, 1%, SM, 0603 | 12-2240-01 | 2 |
| R44, R45, R46 | RES, TF, 10, .100 W, 1%, SM, 0805 | 12-1546-01 | 3 |

Figure 5:
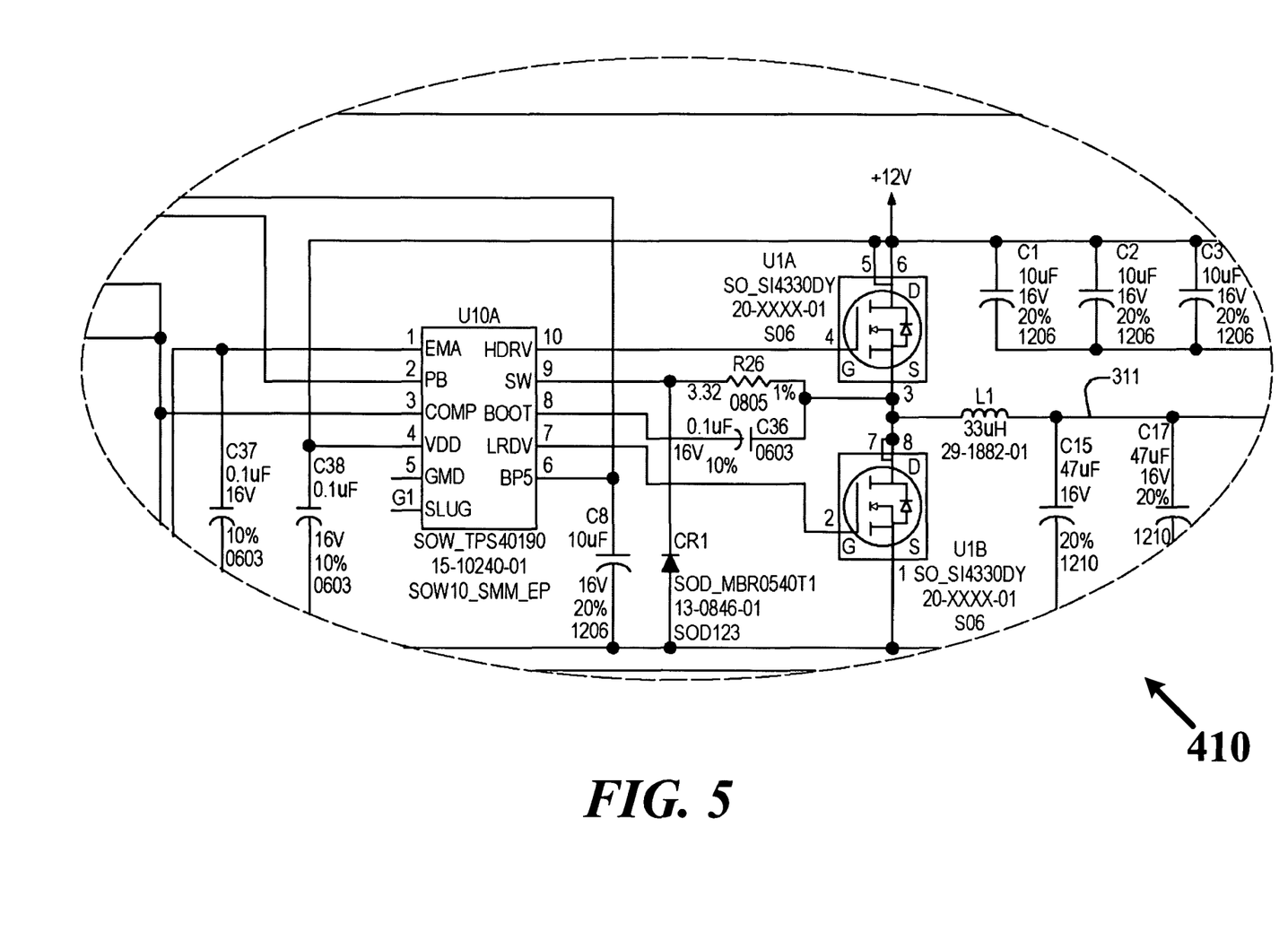
FIG. 5 illustrates an enlarged view of a corresponding portion of the circuit design illustrated in FIG. 4 according to embodiments disclosed herein.

FIG. 5 illustrates a detailed view 410 of an example cooling circuit 306 according to embodiments herein. As shown, controller U10A receives an input voltage derived from the resistor ladder including thermistor R38 that varies with temperature and fixed resistor R24. During operation, the controller U10A turns switches U1A and U1B on and off to control the output voltage 311 between 0 and +5 volts for temperatures greater than approximately 48° C. as discussed above.

Figure 6:
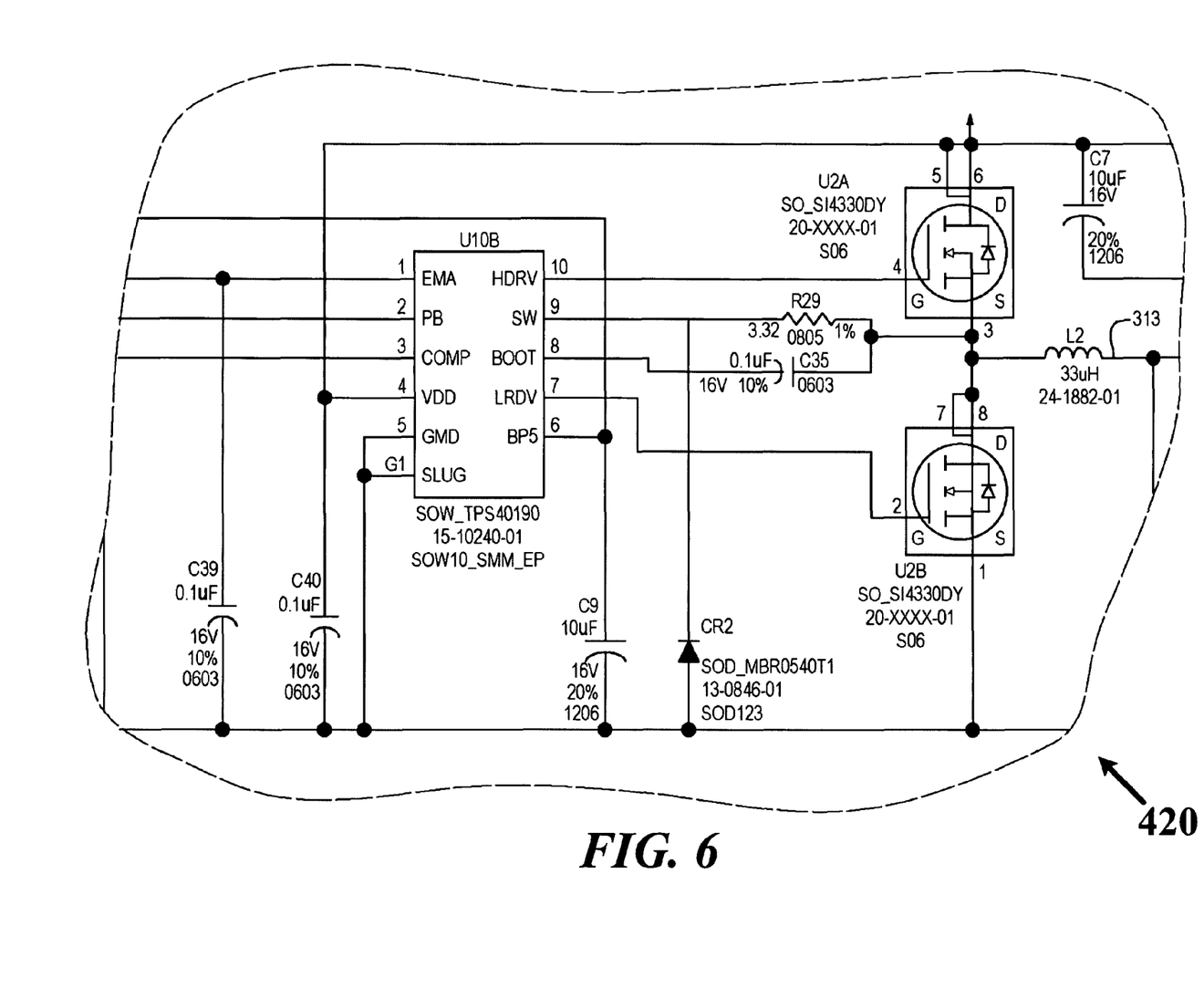
FIG. 6 illustrates an enlarged view of a corresponding portion of the circuit design illustrated in FIG. 4 according to embodiments disclosed herein.

FIG. 6 illustrates a detailed view 420 of an example heating circuit 308 according to embodiments herein. As shown, controller U10B receives an input voltage derived from the resistor ladder including thermistor R39 that varies with temperature and fixed resistor R23. During operation, the controller U10B turns switches U2A and U2B on and off to control the output voltage 313 between 0 and −5 volts for temperatures less than approximately 10° C. as discussed above.

Figure 7:
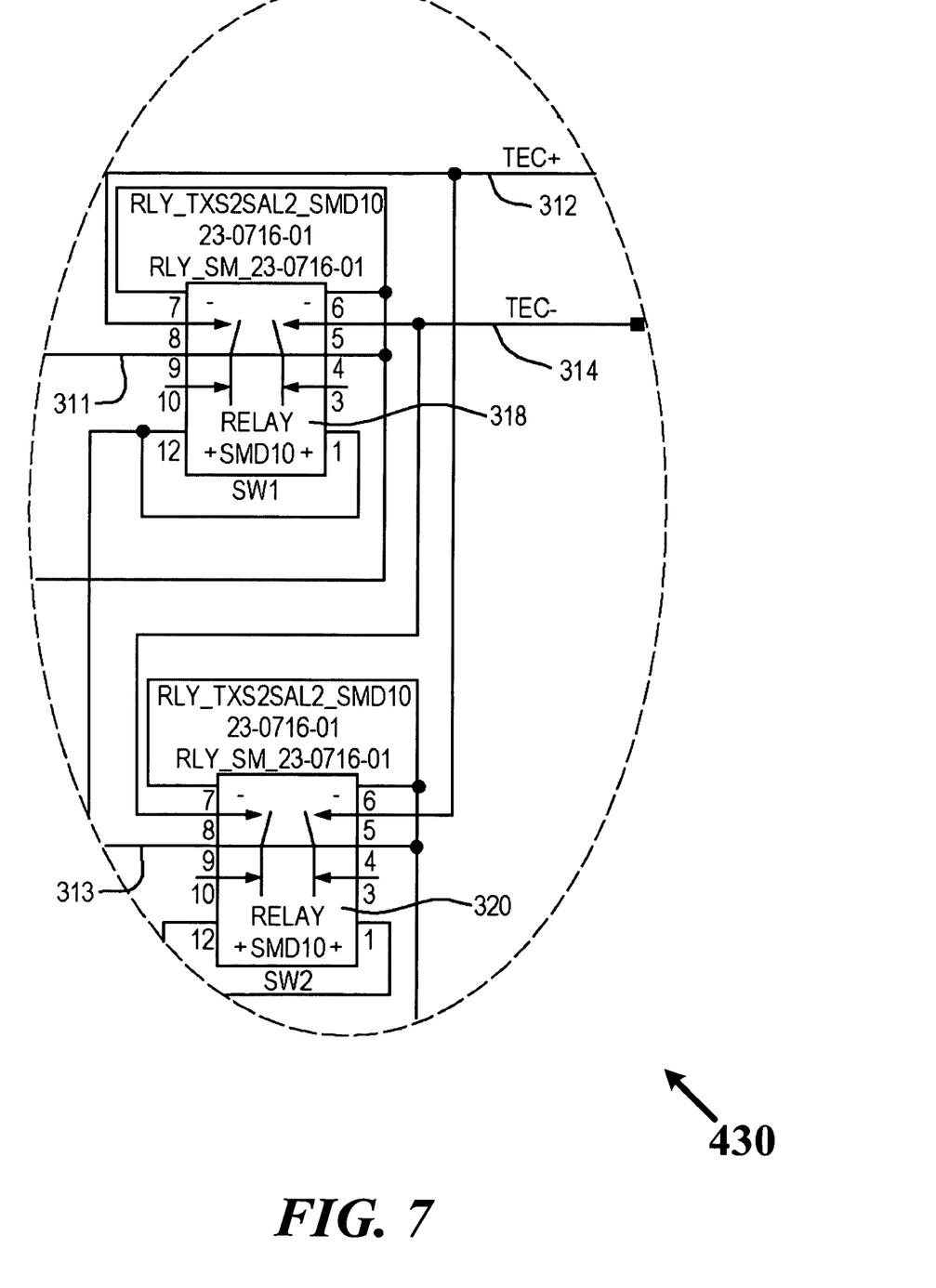
FIG. 7 illustrates an enlarged view of a corresponding portion of the circuit design illustrated in FIG. 4 according to embodiments disclosed herein.

FIG. 7 illustrates a detailed view 430 of example relays 318 and 320 and related circuits according to embodiments herein. As previously discussed, when the sensed temperature is greater than approximately 48° C., the enable circuit 316 sets relay 318 so that output voltage 311 is electrically connected to TEC+ and sets relay 320 so that TEC− is connected to ground. When the sensed temperature is between 10 and 48° C., the enable circuit 316 sets both relay 318 and relay 320 so that TEC+ and TEC− are set to ground. When the sensed temperature is less than approximately 10° C., the enable circuit 316 sets relay 320 so that output voltage 313 is electrically connected to TEC− and sets relay 318 so that TEC+ is connected to ground.

Figure 8:
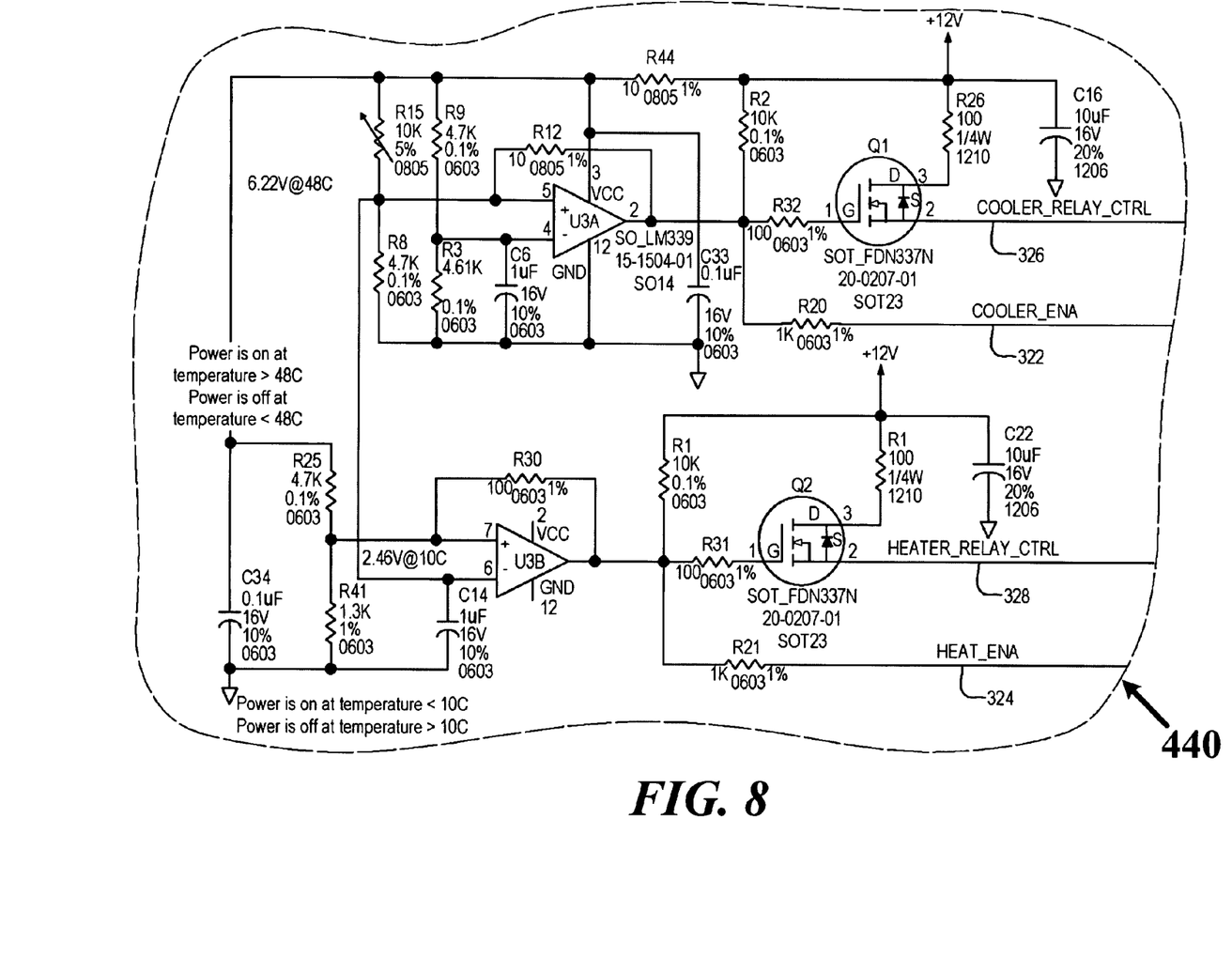
FIG. 8 illustrates an enlarged view of a corresponding portion of the circuit design illustrated in FIG. 4 according to embodiments disclosed herein.

FIG. 8 illustrates a detailed view 440 of example enable circuit 316 according to embodiments herein. As shown, the output of device U3A changes state depending on whether the temperature as sensed by T1 is above or below a threshold value. Likewise, the output of device U3B changes state depending on whether the temperature as sensed by T1 is above or below a second threshold value.

Figure 9:
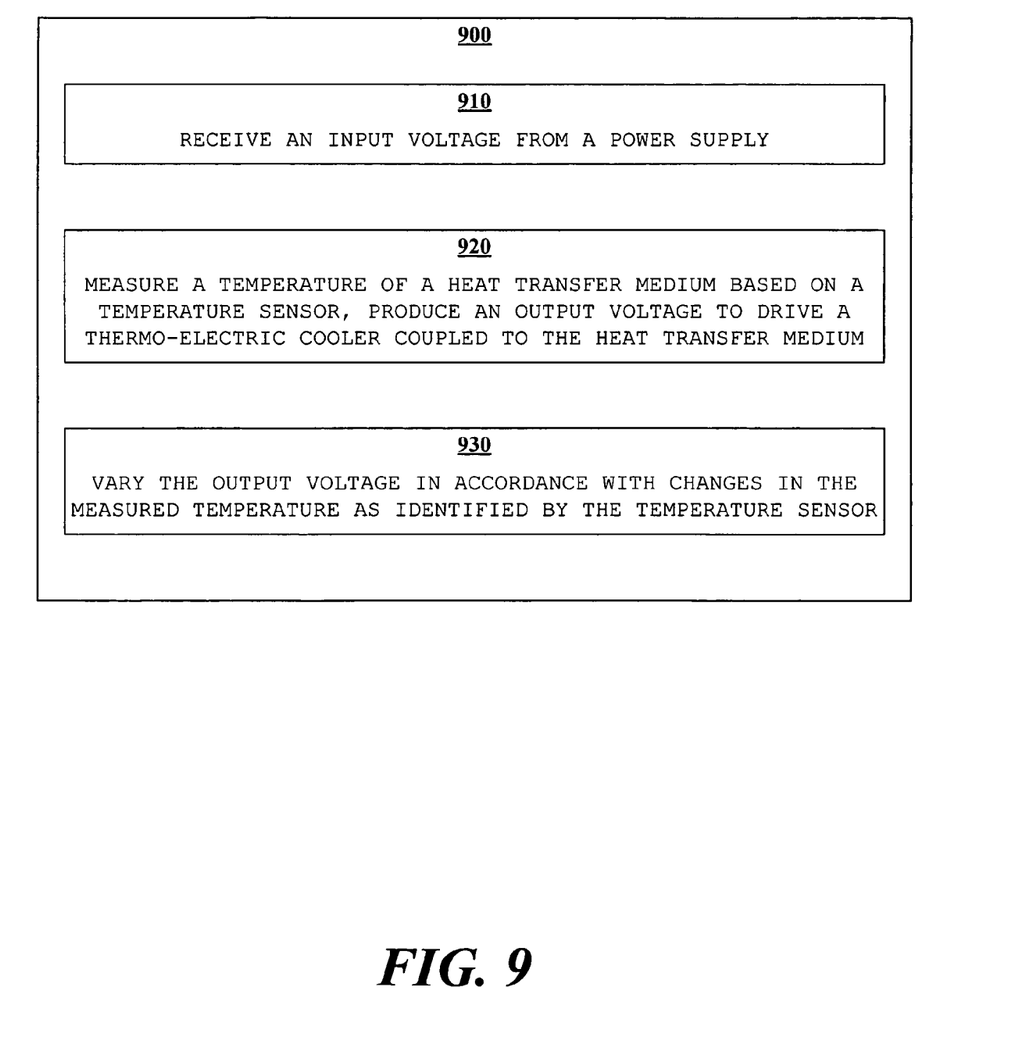
FIG. 9 illustrates an example method for regulating the temperature of electronic devices in accordance with embodiments disclosed herein.

FIG. 9 is an example flowchart 900 illustrating a method for regulating the temperature of electronic devices, a cold plate, etc. in accordance with embodiments disclosed herein.

In step 910, the analog control circuit 302 receives an input voltage from a power supply. For example, as disclosed herein, the analog control circuit 302 can receive a voltage signal from a DC power source such as a power source providing 12 volt DC.

In step 920, the analog control circuit 302 measures a temperature of a heat transfer medium such as cold plate 310 based on one or more temperature sensors. In an example embodiment, the one or more thermistors are disposed in a corresponding resistor ladder of an analog control circuit. Based on changes in the resistance of the one or more thermistors, the voltage regulator 108 produces an output voltage to drive a thermo-electric cooler 104 coupled to the heat transfer medium. An example is shown in FIG. 3, wherein the example voltage regulator circuit includes temperature sensors T2 and T3 to measure the temperature of a heat transfer medium (i.e., the cold plate 310). The temperature sensors T2 and T3 are disposed in a resistor ladder of the analog control circuit 302 as shown in example embodiment FIG. 4. The analog control circuit 302 produces output voltages 311 and 313 to drive the thermo-electric cooler 304, which is coupled to the cold plate 310.

In step 930, the analog control circuit 302 varies the output voltages 311 and 313 in accordance with changes in the measured temperature as sensed by the one or more temperature sensors. For example, the voltage regulator of FIG. 3 varies the output voltages 311 and 313 in accordance with changes in the temperature of the cold plate 310 as measured by the temperature sensors T2 and T3. The cooling circuit 306 varies the output voltage 311 in accordance with changes in the temperature of the cold plate 310 as measured by temperature sensor T2 and the heating circuit 308 varies the output voltage 313 in accordance with changes in the temperature of the cold plate 310 as measured by temperature sensor T3. In one embodiment, the enable circuit 316 senses the temperature of sensor T1 and electrically couples (e.g., via use of relays) the thermo-electric cooler to the positive voltage provided by the cooling circuit of to the negative voltage provided by the heating circuit, as appropriate, depending on the temperature of sensor T1. The enable circuit also turns off the heating and cooling circuits as appropriate, depending on the temperature of T1.

Figure 10:
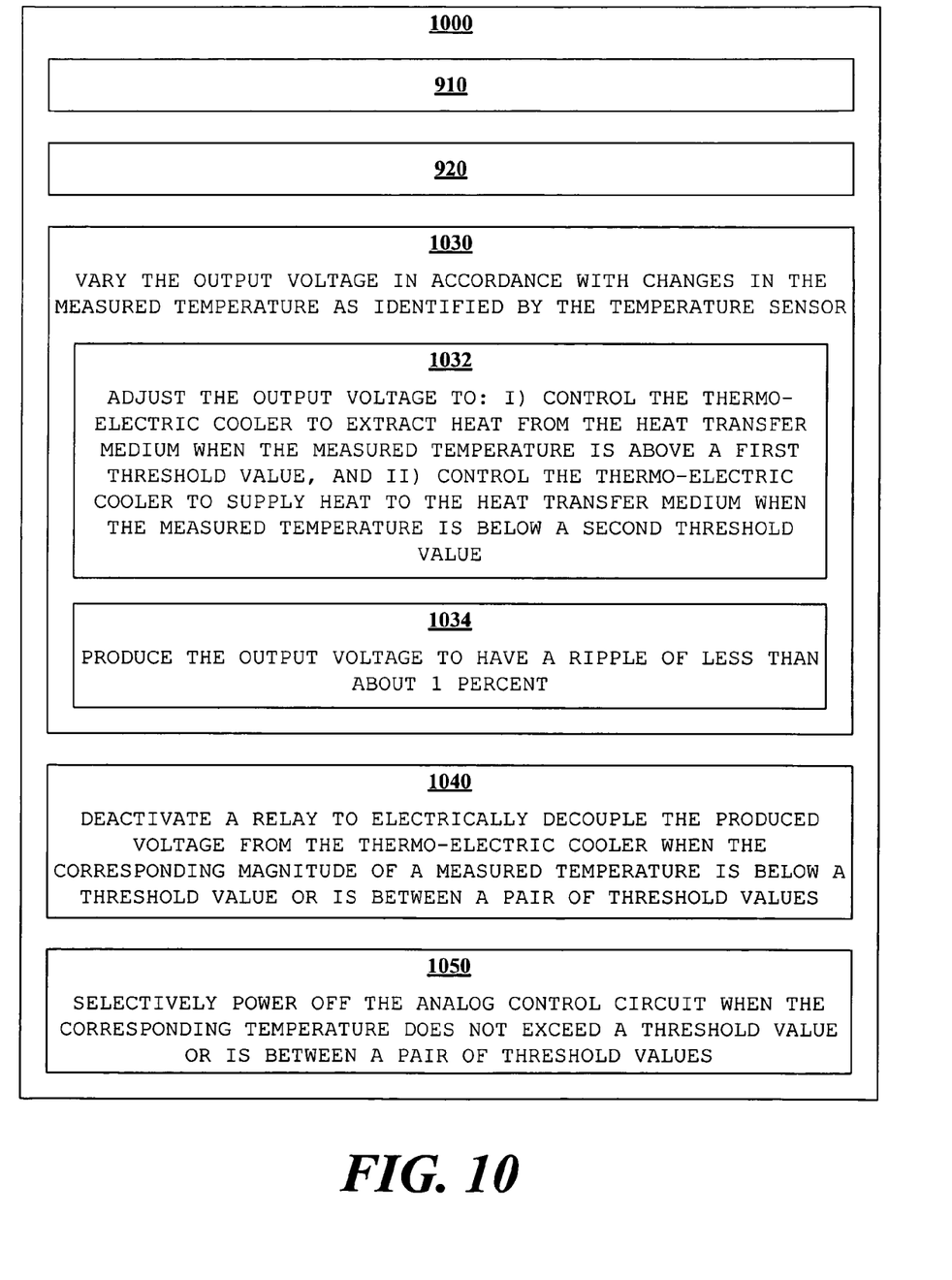
FIG. 10 illustrates another example method for regulating the temperature of electronic devices in accordance with embodiments disclosed herein.

FIG. 10 is an example flowchart 1000 illustrating another method for regulating the temperature of one or more electronic devices in accordance with embodiments disclosed herein. Steps 910 and 920 are the same as described above in relation to FIG. 9.

Step 1030 is a particular embodiment of step 930. In step 1030, the voltage regulator varies the output voltage in accordance with changes in the measured temperature as identified by the temperature sensor. In this embodiment of step 930, step 930 comprises both step 1032 and step 1034. In other embodiments, step 930 may comprise either step 1032 or step 1034.

In step 1032, the voltage regulator adjusts the output voltage to: 1) control the thermo-electric cooler to extract heat from the heat transfer medium when the measured temperature is above a first threshold value, and 2) control the thermo-electric cooler to supply heat to the heat transfer medium when the measured temperature is below a second threshold value. For example, the voltage regulator of FIG. 3 controls the thermo-electric cooler 304 to extract heat from the cold plate 310 when the temperature of the cold plate 310, as measured by temperature sensor T2, is above about 48° C. Also by way of example, the voltage regulator of FIG. 3 controls the thermo-electric cooler 304 to supply heat to the cold plate 310 when the temperature of the cold plate 310, as measured by temperature sensor T3, is below about 10° C.

In step 1034, the voltage regulator produces the output voltage to have a ripple of less than about 1 percent. For example, the voltage regulator of FIG. 3 having an analog control circuit implemented using the design circuit 302 produces an output voltage 312, 314 having a ripple of less than about 1 percent. In other particular embodiments, voltage regulators may produce an output voltage having less than about 5 percent ripple.

In step 1040, the voltage regulator deactivates a relay to electrically decouple the produced voltage from the thermo-electric cooler when the corresponding temperature does not exceed a threshold value or when the temperature is between a pair of threshold values. For example, the voltage regulator of FIG. 3 deactivates relay 1 318 to electrically decouple the produced voltage 311 from the thermo-electric cooler 304 when the corresponding temperature, as measured by temperature sensor T2, is below (i.e., does not exceed) a threshold value (e.g., 48° C.). Additionally, the voltage regulator of FIG. 3 deactivates relay 2 (e.g., relay 320) to electrically decouple the produced voltage 313 from the thermo-electric cooler 304 when the corresponding temperature, as measured by temperature sensor T3, is above a threshold value (e.g., 10° C.).

In step 1050, the voltage regulator selectively powers off the analog circuit when the corresponding magnitude of the temperature as measured by temperature sensor 110 is below a threshold value or when the temperature is between a pair of threshold values as discussed above. For example, the voltage regulator of FIG. 3 powers off the cooling circuit 306 part of the analog control circuit 302 when the corresponding temperature, as measured by temperature sensor T2, is below a first threshold value (e.g., 48° C.) and is above a second threshold value (e.g., 10° C.).

Additionally, note that the voltage regulator of FIG. 3 can power off the heating circuit 308 part of the analog control circuit 302 when the corresponding temperature, as measured by temperature sensor T3, is above a threshold value (e.g., 10° C.).

Methods, apparatus, and systems useful for regulating the temperature of electronic devices are herein disclosed. While inventive matter has been shown and described herein with reference to specific embodiments thereof, it should be understood by those skilled in the art that variations, alterations, changes in form and detail, and equivalents may be made or conceived of without departing from the spirit and scope of the inventive matter. Accordingly, the scope of the present invention should be assessed as that of the appended claims and by equivalents thereto.

What is claimed is:

1. A system comprising:
   a thermo-electric cooler coupled to a heat transfer medium;
   at least one temperature sensor to monitor a corresponding temperature of the heat transfer medium; and
   an analog control circuit configured to produce a voltage signal to drive the thermo-electric cooler, a magnitude of the produced voltage signal depending on the corresponding temperature of the heat transfer medium as detected by the at least one temperature sensor.

2. The system as in claim 1, wherein the analog control circuit includes an analog regulator circuit; and
   wherein the at least one temperature sensor resides in a corresponding resistor ladder of the analog regulator circuit to derive the voltage signal for driving the thermoelectric cooler.

3. The system as in claim 2, wherein the at least one temperature sensor is a thermistor having a resistance that varies depending on the corresponding temperature of the heat transfer medium.

4. The system as in claim 1 further comprising:
   an enable circuit configured to monitor the corresponding temperature of the heat transfer medium and produce an enable signal to selectively power off the analog control circuit when the corresponding temperature does not exceed a threshold value.

5. The system as in claim 4 further comprising:
   a relay disposed between the analog control circuit and the thermo-electric cooler; and
   wherein the enable circuit is configured to drive the relay to electrically decouple the analog control circuit from the thermo-electric cooler when the corresponding temperature does not exceed the threshold value.

6. The system as in claim 1 further comprising:
   a heat source coupled to the heat transfer medium; and
   wherein the analog control circuit is configured to activate the thermo-electric cooler to transfer heat produced by the heat source from the heat transfer medium to a heat sink device.

7. The system as in claim 1, wherein the analog control circuit includes a first analog regulator circuit and a second analog regulator circuit;
   the first analog regulator circuit configured to produce the voltage signal to drive the thermo-electric cooler when the corresponding temperature, as measured by the at least one temperature sensor, is above a first threshold value; and
   the second analog regulator circuit configured to produce the voltage signal to drive the thermo-electric cooler when the corresponding temperature, as measured by the at least one temperature sensor, is below a second threshold value.

8. The system as in claim 7, wherein the voltage signal produced by the first analog regulator circuit to drive the thermo-electric cooler causes the thermo-electric cooler to transfer heat from the transfer medium to a heat sink device when the corresponding temperature is above the first threshold value; and
   wherein the voltage signal produced by the second analog regulator circuit to drive the thermo-electric cooler causes the thermo-electric cooler to transfer heat from the heat sink device to the heat transfer medium when the corresponding temperature is below the second threshold value.

9. The system as in claim 8 further comprising:
an enable circuit configured to monitor the corresponding temperature of the heat transfer medium based on input from the at least one temperature sensor, the enable circuit producing a control signal used to couple the first analog regulator circuit to the thermo-electric cooler when the temperature is above the first threshold value and producing a control signal used to couple the second analog regulator circuit to the thermo-electric cooler when the temperature is below the second threshold value.

10. The system as in claim 9, wherein the enable circuit decouples both the first analog regulator circuit and the second analog regulator circuit from the thermo-electric cooler when the temperature of the transfer medium is between the first threshold value and the second threshold value.

11. The system as in claim 1, wherein the analog control circuit is configured to control a direction of heat being transferred through the heat transfer medium based on changing a polarity of the voltage signal.

12. The system as in claim 1, wherein the voltage signal produced by the analog control circuit has a ripple of less than about 1 percent.

13. The system as in claim 1, wherein the analog control circuit is configured to change a polarity of the voltage signal depending on the corresponding temperature of the heat transfer medium, a first polarity of the voltage signal used to activate the thermo-electric cooler to transfer heat from the heat transfer medium to a heat sink device when the temperature of the heat transfer medium exceeds a first threshold value, a second polarity of the voltage signal used to activate the thermo-electric cooler to transfer heat from the heat sink device to the heat transfer medium when the corresponding temperature of the heat transfer medium is below a second threshold value.

14. A method comprising:
receiving an input voltage from a power supply;
measuring a temperature of a heat transfer medium based on a temperature sensor disposed in a resistor ladder of an analog control circuit, the analog control circuit producing an output voltage to drive a thermo-electric cooler coupled to the heat transfer medium; and
varying the output voltage in accordance with changes in the measured temperature as identified by the temperature sensor.

15. The method as in claim 14, wherein varying the output voltage includes adjusting the output voltage to: i) a positive voltage value to control the thermo-electric cooler to extract heat from the heat transfer medium when the measured temperature is above a first threshold value, and ii) a negative voltage value to control the thermo-electric cooler to supply heat to the heat transfer medium when the measured temperature is below a second threshold value.

16. The method as in claim 14 further comprising:
decoupling the produced voltage from the thermo-electric cooler when the corresponding temperature does not exceed a threshold value.

17. The method as in claim 14 further comprising:
selectively powering off the analog control circuit when the corresponding temperature is between two threshold values.

18. The method as in claim 14, wherein varying the output voltage includes producing the output voltage to have a ripple of less than about 1 percent.

19. The method as in claim 14, wherein varying the output voltage includes:
increasing a magnitude of the output voltage in response to increases in the measured temperature; and
capping the output voltage at a predetermined value when the measured temperature exceeds a threshold value.

20. An apparatus, comprising:
a heat transfer medium;
a thermo-electric cooler thermo-conductively coupled to the heat transfer medium; and
a voltage regulator configured to:
receive an input voltage from a power supply;
measure a temperature associated with the heat transfer medium;
produce an output voltage to drive the thermo-electric cooler;
change a polarity of the output voltage and vary the output voltage in accordance with changes in the measured temperature to extract heat from the heat transfer medium when the measured temperature is above a first threshold value and supply heat to the heat transfer medium when the measured temperature is below a second threshold value.

21. An apparatus as in claim 20, wherein the voltage regulator generates the output voltage in accordance with a first polarity to extract heat from the heat transfer medium when the measured temperature is above the first threshold value; and
wherein the voltage regulator generates the output voltage in accordance with a second polarity to supply heat to the heat transfer medium when the measured temperature is below the second threshold value, the first polarity being opposite to the second polarity.

* * * * *